United States Patent
Li et al.

(10) Patent No.: US 8,258,815 B2
(45) Date of Patent: Sep. 4, 2012

(54) CLOCK GENERATOR CIRCUITS FOR GENERATING CLOCK SIGNALS

(75) Inventors: Chia Ching Li, Lujhou (TW); Hsin Yi Ho, Hsinchu (TW); Chun Hsiung Hung, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 331 days.

(21) Appl. No.: 12/716,912

(22) Filed: Mar. 3, 2010

(65) Prior Publication Data
US 2011/0215837 A1    Sep. 8, 2011

(51) Int. Cl.
*H03K 19/096* (2006.01)
*H03K 5/01* (2006.01)
(52) U.S. Cl. ............. 326/95; 327/165; 327/291; 326/98
(58) Field of Classification Search .................... 326/95, 326/93, 98, 112, 119–122; 327/165, 166, 327/172, 176, 291, 294
See application file for complete search history.

(56) References Cited

U.S. PATENT DOCUMENTS

| | | | | |
|---|---|---|---|---|
| 5,815,030 A | * | 9/1998 | Wuidart et al. | 327/551 |
| 6,570,408 B2 | * | 5/2003 | Nowka | 326/95 |
| 7,123,056 B2 | * | 10/2006 | Sung et al. | 326/97 |

* cited by examiner

Primary Examiner — Daniel D Chang
(74) Attorney, Agent, or Firm — Alston & Bird LLP

(57) ABSTRACT

The present invention relates to a circuit for generating a clock signal. The circuit comprises a current source to generate a reference current and provide a first voltage $V_1$, a first current generator to generate a first mirror current during a first half cycle based on the reference current, a first capacitor including a first end, and a first transistor having a first threshold voltage $V_{TH1}$. The first transistor includes a gate to receive the first voltage $V_1$, a drain coupled to the first current generator and a source coupled to the first end of the first capacitor so as to allow the first mirror current to charge the first capacitor during the first half cycle, wherein the period of the first half cycle is a function of the first bias voltage $V_1$ minus the first threshold voltage $V_{TH1}$.

20 Claims, 10 Drawing Sheets

CLOCK GENERATOR CIRCUITS FOR GENERATING CLOCK SIGNALS

BACKGROUND OF THE INVENTION

The present invention generally relates to clock generator circuits. More particularly, the present invention relates to clock generator circuits for providing stable clock signals and double frequency clock signals in memory devices. The clock generator circuits in accordance with the present invention may serve as an oscillator or a frequency doubler.

Clock circuits play an important role in modern electronic products. Generally, a clock signal generated by a clock circuit within an integrated circuit or on a printed circuit board of an electronic device is used for signal synchronization in the electronic device. Moreover, a clock circuit may generate clock signals at different clock rates for applications requiring different operation frequencies. The clock signals of different clock rates may be generated by multiplying or dividing the frequency of a reference clock signal.

A clock signal may be generated by a resistance-capacitance (RC) delay circuit. FIG. 1 is a circuit diagram of an RC delay clock generator 10 in prior art. Referring to FIG. 1, the RC delay clock generator 10 may include resistors $R_1$ and $R_2$ and capacitors $C_1$ and $C_2$, wherein $R_1$ and $C_1$ form a first RC delay circuit and $R_2$ and $C_2$ form a second RC delay circuit. Under the control of a clock enable signal $Clk_{en}$, an output clock signal $Clk_{out}$ of the clock generator 10 may be generated. The output clock signal $Clk_{out}$ has a period $T_1$ equal to $R_1C_1+R_2C_2$. However, the clock generator 10 may be susceptible to variations in supply voltage $V_{DD}$ and temperature, which may cause deviations in the time constants $R_1C_1$ and $R_2C_2$, resulting in an unstable and unreliable output clock signal $Clk_{out}$.

To address the issue, a clock circuit substantially free from the $V_{DD}$ and temperature variations has been proposed. FIG. 2 is a circuit diagram of a clock generator 20 in prior art. Referring to FIG. 2, the clock generator 20 may include a bandgap circuit 21 and a constant current generator 22. The bandgap circuit 21 may generate a reference current $I_{REF}$ and a reference voltage $V_{REF}$. The current generator 22 may generate a bias voltage $V_{bias}$, which may cause the generation of a mirror current $I_{CONST}$ based on the reference current $I_{REF}$. Under the control of a clock enable signal $Clk_{en}$, an output clock signal $Clk_{out}$ has a period $T_2$ equal to $2C(V_{REF}/I_{CONST})$, where "C" represents the capacitance of capacitors $C_3$ and $C_4$ in the clock generator 20. Although the clock generator 20 may provide a more stable and reliable output clock signal than the clock generator 10 illustrated in FIG. 1, the bandgap circuit 21 may be so complicated as to render the clock generator 20 cost ineffective or chip area inefficient in some applications. Moreover, the setup time of the bandgap circuit 21, on the order of several microseconds (us), may not be acceptable in certain applications.

Like the clock generators, frequency multipliers and dividers may also suffer $V_{DD}$ and temperature variations. FIG. 3A is a circuit diagram of a frequency multiplier 30 in prior art. Referring to FIG. 3A, the frequency multiplier 30 includes an RC delay one-shot pulse circuit, which generates an output clock signal $Clk_{out}$ in response to external clock signals $Clk_{ext}$. FIG. 3B is a diagram illustrating the waveforms of the external clock signals $Clk_{ext}$, the output clock signal $Clk_{out}$ and the signals at points "a" and "b" in FIG. 3A. Given a 50% duty cycle, the pulse widths of the signals at points "a" and "b" may be significantly smaller (shown in solid lines) or greater (shown in dashed lines) than a desired one due to variations in $V_{DD}$ and temperature, resulting in deviations in the output clock signal $Clk_{out}$. To address the issue, a phase lock loop (PLL) may be used to track and stabilize the duty cycle. However, PLL may cause other issues such as stability and design complexity.

It may therefore be desirable to have a clock generator that is able to alleviate the issue of $V_{DD}$ and temperature variations and may be designed in a relatively simple structure.

BRIEF SUMMARY OF THE INVENTION

Examples of the present invention may provide a circuit for generating a clock signal. The circuit comprises a current source to generate a reference current and provide a first voltage $V_1$, a first current generator to generate a first mirror current during a first half cycle based on the reference current, a first capacitor including a first end, and a first transistor having a first threshold voltage $V_{TH1}$. The first transistor includes a gate to receive the first voltage $V_1$, a drain coupled to the first current generator and a source coupled to the first end of the first capacitor so as to allow the first mirror current to charge the first capacitor during the first half cycle, wherein the period of the first half cycle is a function of the first bias voltage $V_1$ minus the first threshold voltage $V_{TH1}$.

Some examples of the present invention may also provide a circuit for generating a clock signal. The circuit comprises a first current generator to generate a first mirror current, a first capacitor, a first transistor coupled between the first current generator and the first capacitor, and a first discharging transistor. The first transistor having a first threshold voltage $V_{TH1}$ includes a gate to receive a first voltage $V_1$ and allows the first mirror current to charge the first capacitor during a first half cycle. Furthermore, the first discharging transistor allows the first capacitor to discharge during a second half cycle.

Examples of the present invention may further provide a circuit for generating a clock signal. The circuit comprises a first current generator to generate a first mirror current, a first capacitor, a first transistor coupled between the first current generator and the first capacitor to allow the first mirror current to charge the first capacitor during a first half cycle, a second current generator to generate a second mirror current, a second capacitor, and a second transistor coupled between the second current generator and the second capacitor to allow the second mirror current to charge the second capacitor during a second half cycle. The period of the clock signal is a function of $(V_1-V_{TH1})$ and $(V_1-V_{TH2})$, where $V_1$ is a voltage to bias the first and the second transistors, and $V_{TH1}$ and $V_{TH2}$ are the threshold voltages of the first and the second transistors, respectively.

Examples of the present invention may also provide a clock generator circuit. The clock generator circuit may include a current source and a first clock circuit. The first clock circuit may be coupled to the current source. The first clock circuit may include a first current generator comprising a first transistor and a second transistor, wherein a source of the first transistor may be coupled to a power supply and a drain of the first transistor may be coupled to a source of the second transistor. The first clock circuit may also include a third transistor of which a drain may be coupled to a drain of the second transistor, a fourth transistor of which a drain may be coupled to a source of the third transistor and a source may be grounded, and a first capacitor of which a first end may be coupled to the source of the third transistor and the drain of the fourth transistor and a second end may be grounded.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings.

DETAILED DESCRIPTION OF THE INVENTION

Reference will now be made in detail to the present examples of the invention, examples of which are illustrated in the accompanying drawings. Wherever possible, the same reference numbers will be used throughout the drawings to refer to the same or like parts.

Figure 4A:
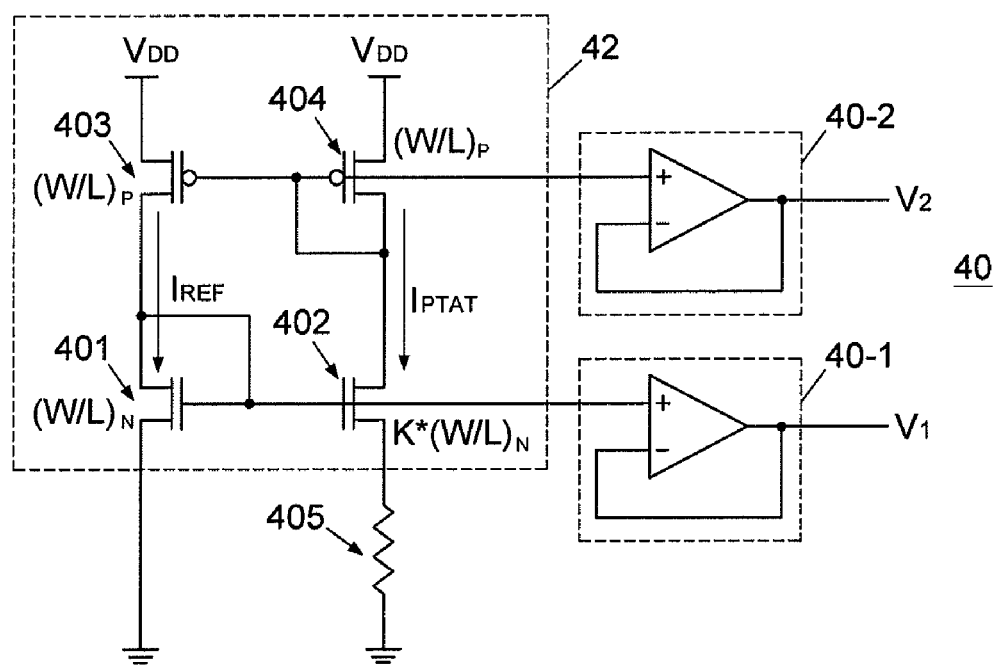
FIG. 4A is a circuit diagram of a current source according to an example of the present invention.

FIG. 4A is a circuit diagram of a current source 40 according to an example of the present invention. Referring to FIG. 4A, the current source 40 may include a current mirror 42, a first buffer 40-1 and a second buffer 40-2. The current mirror 42 may include n-type metal-oxide-semiconductor (NMOS) field effect transistors 401 and 402 and p-type metal-oxide-semiconductor (PMOS) field effect transistors 403 and 404. In the current mirror 42, a reference current $I_{REF}$ flowing through the transistors 403 and 401 may "mirror" a current $I_{PTAT}$ flowing through the transistors 404 and 402. The current $I_{PTAT}$ may vary in a way "proportional to absolute temperature" (PTAT). That is, the current $I_{PTAT}$ may vary directly or positively proportionally as the absolute temperature varies. The current $I_{PTAT}$ may be expressed in an equation below.

$$I_{PTAT} = [2/(\mu_n C_{ox}(W/L)_n)][(1/R)(1-1/\sqrt{k})]^2,$$

wherein "R" is the resistance of a resistor 405, $\mu_n$ is the dielectric constant of the NMOS transistors 402, $C_{ox}$ is the capacitance of oxide in the NMOS transistors 402, $(W/L)_n$ is a width-to-length ratio of the NMOS transistors 402 and "k" is a ratio of the area of the transistor 401 to the area of the transistor 402.

The current source 40 may provide a first voltage $V_1$ at an output of the first buffer 40-1, and a second voltage $V_2$ at an output of the second buffer 40-2. The first buffer 40-1 may include a non-inverting terminal coupled to the gates of the NMOS transistors 401 and 402, and an inverting terminal coupled via a feedback path with the output $V_1$. The second buffer 40-2 may include a non-inverting terminal coupled to the gates of the PMOS transistors 403 and 404, and an inverting terminal coupled via a feedback path with the output $V_2$. The first and second buffers 40-1 and 40-2, each being configured to serve as a voltage follower in the present example, may enhance the driving ability of the current source 40. Specifically, the values of the first and second voltages $V_1$ and $V_2$ may be compensated or automatically adjusted via the feedback paths.

In other examples, the first and second buffers 40-1 and 40-2 may be eliminated so that the first voltage $V_1$ may be provided at the gates of the NMOS transistors 401 and 402 and the second voltage $V_2$ may be provided at the gates of the PMOS transistors 403 and 404.

Figure 4B:
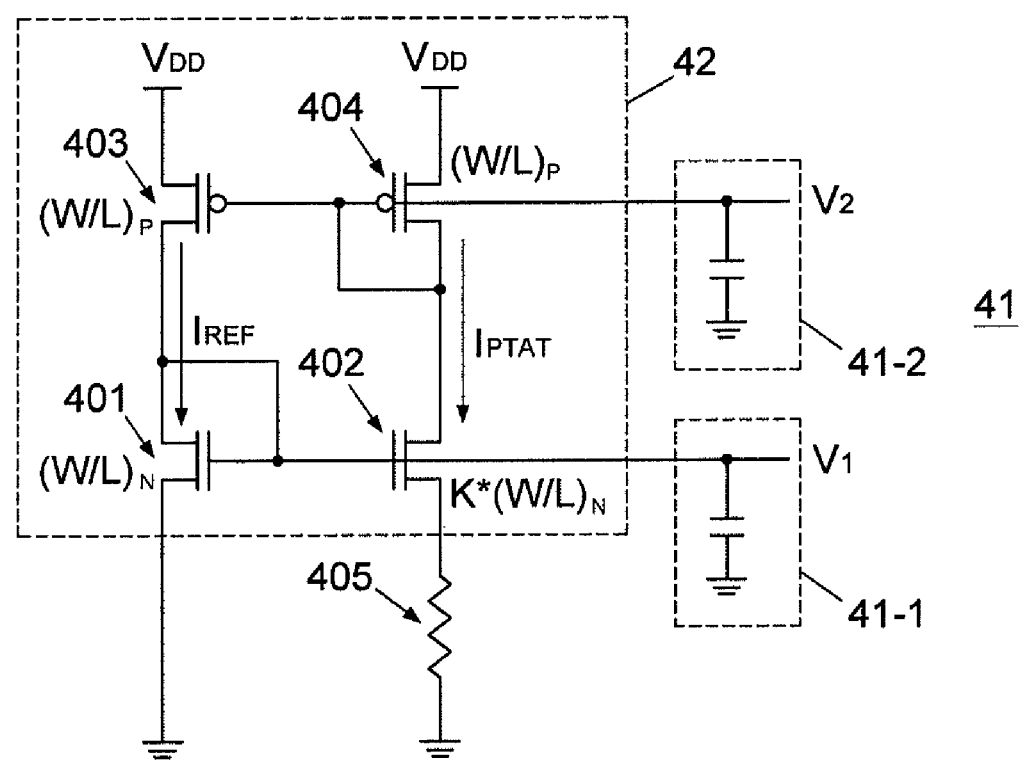
FIG. 4B is a circuit diagram of a current source according to another example of the present invention.

FIG. 4B is a circuit diagram of a current source 41 according to another example of the present invention. Referring to FIG. 4B, the current source 41 may be similar to the current source 40 illustrated in FIG. 4A except that, for example, a first capacitor 41-1 and a second capacitor 41-2 replace the first buffer 40-1 and the second buffer 40-2, respectively. The first capacitor 41-1 may be coupled between a reference or ground potential and the gates of the NMOS transistors 401 and 402. The second capacitor 40-2 may be coupled between the ground potential and the gates of the PMOS transistors 403 and 404. The capacitors 41-1 and 41-2 may be configured to maintain the first and second voltages $V_1$ and $V_2$ substantially constant. Both of the current sources 40 and 41 respectively described and illustrated with reference to FIG. 4A and FIG. 4B can keep relatively stable voltage in $V_1$ and $V_2$ without the coupling effect issue.

Figure 5A:
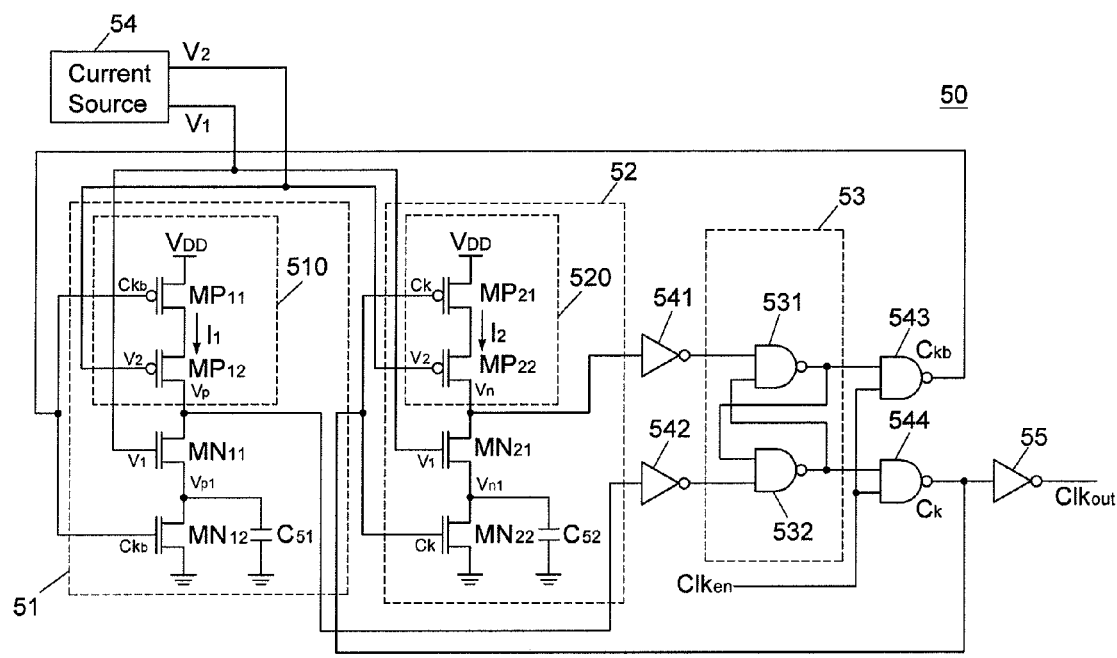
FIG. 5A is a circuit diagram of a clock generator to serve as an oscillator according to an example of the present invention.

FIG. 5A is a circuit diagram of a clock generator 50 to serve as an oscillator according to an example of the present invention. Referring to FIG. 5A, the clock generator 50 may include a first clock circuit 51, a second clock circuit 52, a latch circuit 53 and a current source 54. The current source 54 may be similar to one of the current sources 40 and 41 described and illustrated with reference to FIGS. 4A and 4B, respectively, and thus may generate the current $I_{PTAT}$ and provide the first and second voltages $V_1$ and $V_2$. The first clock circuit 51 may include a first current generator 510, a first transistor (NMOS) $MN_{11}$, a first capacitor $C_{51}$ and a first discharging transistor $MN_{12}$. The first current generator 510, further comprising a first PMOS transistor $MP_{11}$ and a second PMOS transistor $MP_{12}$, may generate a first mirror current $I_1$ that is a multiple of the current $I_{PTAT}$. In the present example, it is assumed that the first mirror current $I_1$ equals the current $I_{PTAT}$. The first PMOS transistor $MP_{11}$ may include a source coupled to a voltage supply $V_{DD}$. The second PMOS transistor $MP_{12}$ may include a gate biased at the second voltage $V_2$ and a source coupled to the drain of the first PMOS transistor $MP_{11}$. The first transistor $MN_{11}$ may include a gate biased at the first voltage $V_1$, a drain coupled to the drain of the second PMOS transistor $MP_{12}$, and a source coupled to one end (not numbered) of the first capacitor $C_{51}$. The first discharging transistor $MN_{12}$ may include a drain coupled to the one end of the first transistor $C_{51}$. Skilled persons in the art will understand that the source and drain of a transistor may be interchangeable, depending on the voltages applied thereto.

Similarly, the second clock circuit 52 may include a second current generator 520, a second transistor (NMOS) $MN_{21}$, a second capacitor $C_{52}$ and a second discharging transistor $MN_{22}$. The second current generator 520, further comprising a first PMOS transistor $MP_{21}$ and a second PMOS transistor $MP_{22}$, may generate a second mirror current $I_2$ substantially equal to $I_{PTAT}$. The first PMOS transistor $MP_{21}$ may include a source coupled to the voltage supply $V_{DD}$. The second PMOS transistor $MP_{22}$ may include a gate biased at the second voltage $V_2$ and a source coupled to the drain of the first PMOS transistor $MP_{21}$. The second transistor $MN_{21}$ may include a gate biased at the first voltage $V_1$, a drain coupled to the drain of the second PMOS transistor $MP_{22}$, and a source coupled to one end (not numbered) of the second capacitor $C_{52}$. The second discharging transistor $MN_{22}$ may include a drain coupled to the one end of the second transistor $C_{52}$.

The latch circuit 53 may include a first NAND gate 531 and a second NAND gate 532 cross-coupled to each other. The first NAND gate 531 may include a first input coupled with the drain of the second transistor $MN_{21}$ of the second clock circuit 52 via a first inverter 541, and a second input coupled to an output of the second NAND gate 532. The second NAND gate 532 may include a first input coupled with the drain of the first transistor $MN_{11}$ of the first clock circuit 51 via a second inverter 542, a second input coupled with an output of the first NAND gate 531, and a third input to receive an enable signal $Clk_{en}$. Furthermore, the output of the first NAND gate 531 may be coupled with the gates of the first PMOS transistor $MP_{11}$ and the first discharging transistor $MN_{12}$ of the first clock circuit 51 via a third inverter 543. The output of the second NAND gate 532 may be coupled with the gates of the first PMOS transistor $MP_{21}$ and the second discharging transistor $MN_{22}$ of the second clock circuit 52 via a fourth inverter 544.

It may be assumed that initially the drain voltage $V_p$ of the first transistor $MN_{11}$ and the drain voltage $V_n$ of the second transistor $MN_{21}$ are below the trigger points of the second and first inverters 542 and 541, respectively, and thus are not able to turn on the first and second inverters 541 and 542. The outputs of the first and second inverters 541 and 542 are therefore at a logic "high" level. Furthermore, it may be assumed that initially the output of the first NAND gate 531 is logic high and the output of the second NAND gate 532 is logic low. In operation, when the enable signal $Clk_{en}$ is asserted, that is, changed to a logic high level, the output of the second NAND gate 532 is logic low and the output of the fourth NAND gate 544, "$C_k$", is logic high. Meanwhile, the output of the third NAND gate 543, "$C_{kb}$", is logic low because $C_{kb}$ is the complement of $C_k$. The logic low $C_{kb}$ may turn on the first PMOS transistor $MP_{11}$ and turn off the first discharging transistor $MN_{12}$, which allows the first mirror current $I_1$ to charge the first capacitor $C_{51}$. The drain voltage of the first discharging transistor $MN_{12}$, "$V_{p1}$", may increase during the charging process until it reaches $V_1-V_{TH1}$, where $V_{TH1}$ is the threshold voltage of the first transistor $MN_{11}$. The first transistor $MN_{11}$ may be turned off as $V_{p1}$ reaches $V_1-V_{TH1}$, and at that time the drain voltage $V_p$ of the first transistor $MN_{11}$ may quickly rise above the trigger point of the second inverter 542, which turns on the second inverter 542 and switches the output of the second inverter 542 from logic high to logic low. Consequently, the output $C_k$ switches to logic low while the output $C_{kb}$ switches to logic high.

The logic high $C_{kb}$ may turn off the first PMOS transistor $MP_{11}$ and turn on the first discharging transistor $MN_{12}$, which cuts off the first mirror current $I_1$ and allows the first capacitor $C_{51}$ to discharge through the first discharging transistor $MN_{12}$. Meanwhile, the logic low $C_k$ may turn on the first PMOS transistor $MP_{21}$ and turn off the second discharging transistor $MN_{22}$, which allows the second mirror current $I_2$ to charge the second capacitor $C_{52}$. The drain voltage of the second discharging transistor $MN_{22}$, "$V_{n1}$", may increase during the charging process until it reaches $V_1-V_{TH2}$, where $V_{TH2}$ is the threshold voltage of the second transistor $MN_{21}$. The second transistor $MN_{21}$ may be turned off as $V_{n1}$ reaches $V_1-V_{TH2}$, and at that time the drain voltage $V_n$ of the second transistor $MN_{21}$ may quickly rise above the trigger point of the first inverter 541, which turns on the first inverter 541 and switches the output of the first inverter 541 from logic high to logic low. Consequently, the output $C_{kb}$ switches to logic low while the output $C_k$ switches to logic high.

Accordingly, the clock generator 50 may generate at an output of an inverter 55 a clock signal $Clk_{out}$ that has a first state, logic low in the present example, during a first half cycle and a second state, logic high, during a second half cycle. The first half cycle may refer to a period when the first capacitor $C_{51}$ is charged from approximately the ground level to $V_1-V_{TH1}$, and the second half cycle may refer to a period when the second capacitor $C_{52}$ is charged from approximately the ground level to $V_1-V_{TH2}$. The period $t_1$ of the first half cycle may be calculated below.

$$t_1 = C_{51}(V_1-V_{TH1})/I_1$$

Likewise, the period $t_2$ of the second half cycle may be calculated below.

$$t_2 = C_{52}(V_1-V_{TH2})/I_2$$

Accordingly, we may obtain the period "T" of the clock signal $Clk_{out}$:

$$T = C_{51}(V_1-V_{TH1})/I_1 + C_{52}(V_1-V_{TH2})/I_2; \text{ or}$$

$T = 2C(V_1-V_{TH})/I_1$, if the first clock circuit 51 is symmetrical to the second clock circuit 52 so that $C_{51}$ equals $C_{52}$, $V_{TH1}$ equals $V_{TH2}$ and $I_1$ equals $I_2$, which may facilitate a 50% duty cycle.

Figure 1:
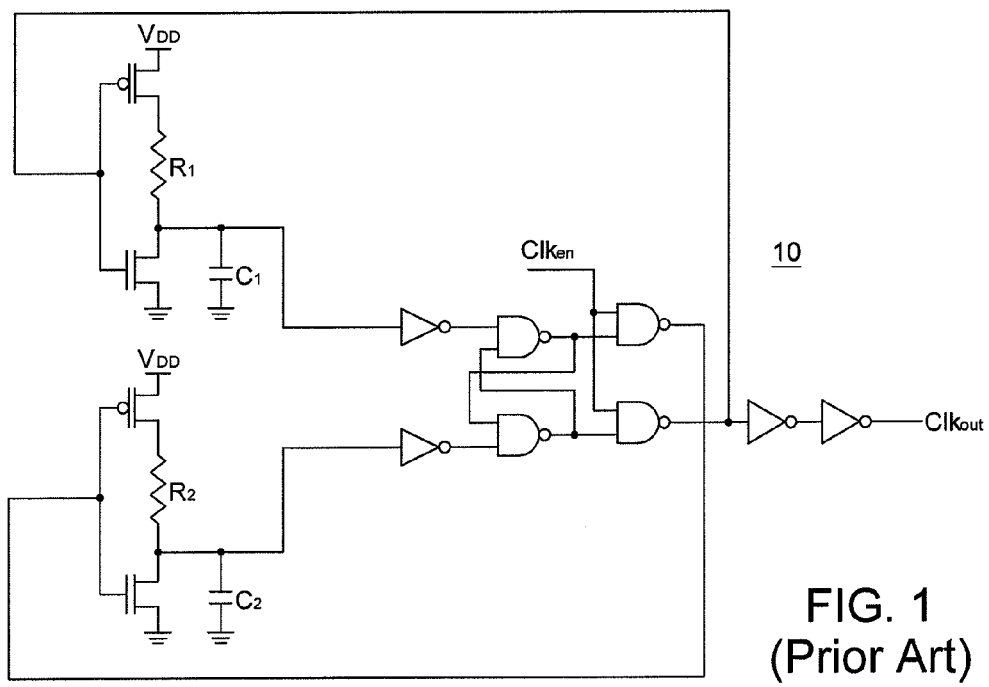
FIG. 1 is a circuit diagram of a resistance-capacitance (RC) delay clock generator in prior art.
Figure 2:
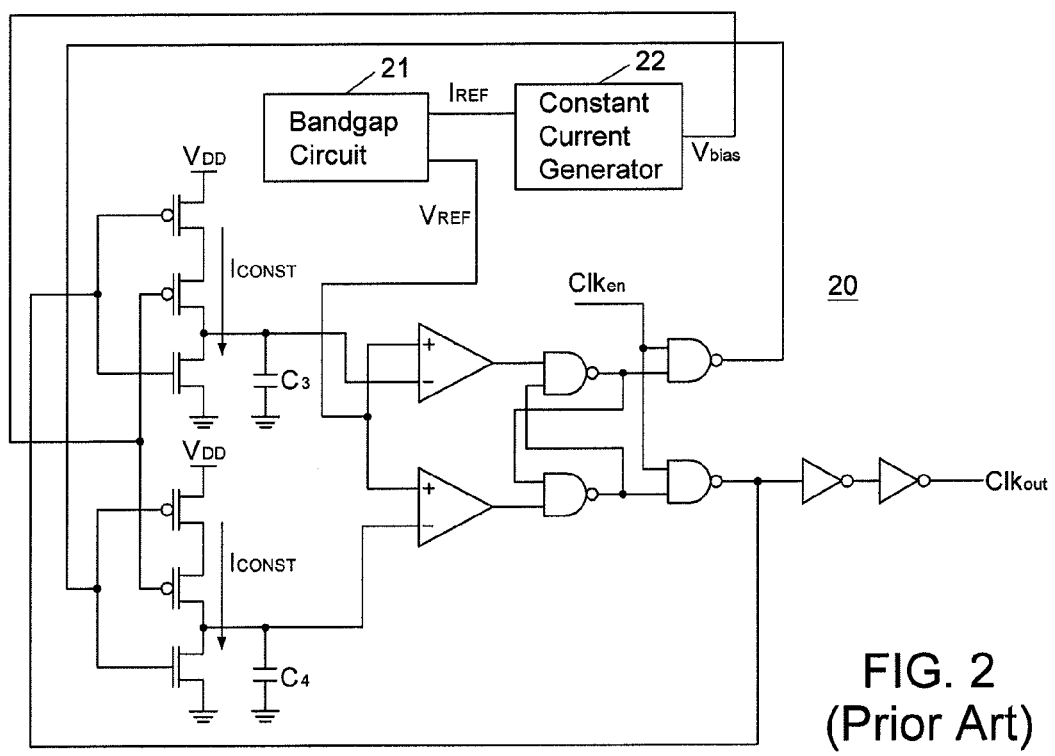
FIG. 2 is a circuit diagram of another clock generator in prior art.
Figure 3A:
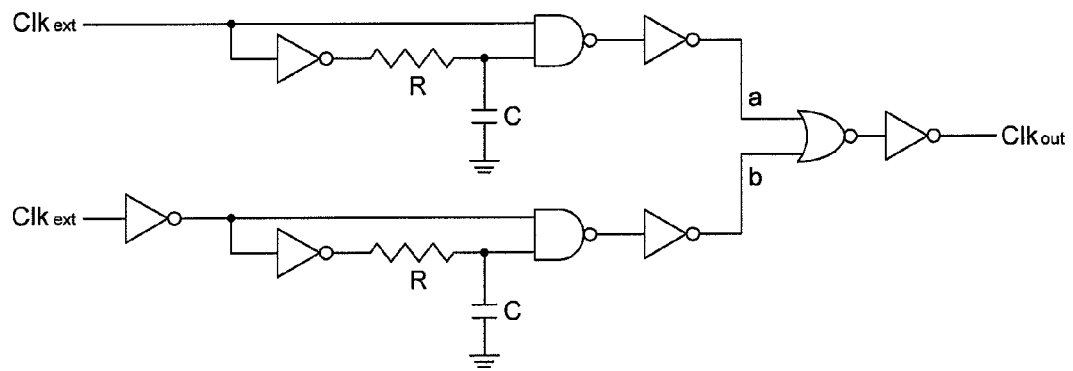
FIG. 3A is a circuit diagram of a frequency multiplier in prior art.
Figure 3B:
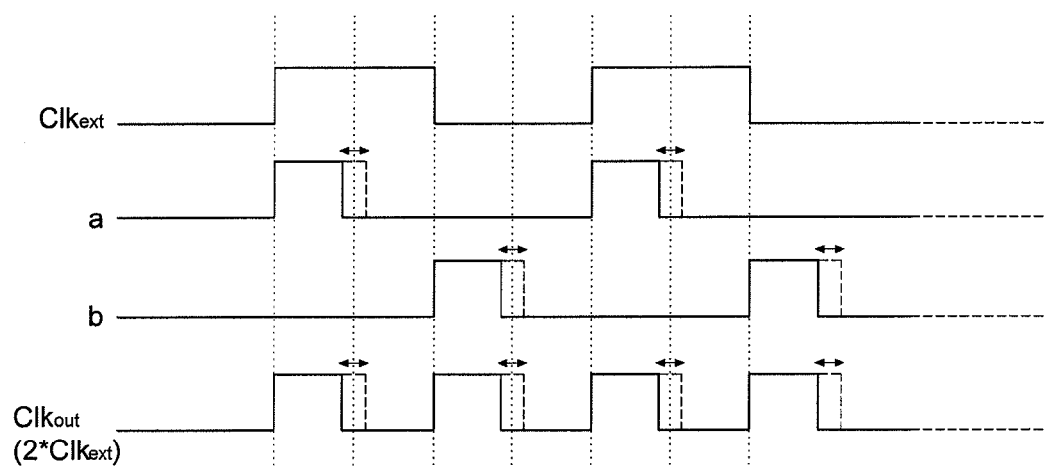
FIG. 3B is a diagram illustrating the waveforms of an external clock signal and an output clock signal of the frequency multiplier illustrated in FIG. 3A.

The clock generator 50 may alleviate the issue of $V_{DD}$ variation because the first and second capacitors $C_{51}$ and $C_{52}$, unlike the RC delay circuits illustrated in FIGS. 1 and 3, wherein the capacitors are charged to approximately $\frac{1}{2}V_{DD}$, are only charged to $V_1-V_{TH1}$ and $V_1-V_{TH2}$, respectively. In one example according to the present invention, $V_1$ may range from approximately 0.8 to 1 volt (V) and $V_{TH1}$ and $V_{TH2}$ may range from approximately 0.3 to 0.4V, given a $V_{DD}$ of 1.8 to 3V. Furthermore, the clock generator 50 may compensate for the temperature variation by means of a temperature compensation mechanism as described below. Generally, the threshold voltage of a transistor may vary inversely as the temperature varies. Furthermore, as previously discussed, the mirror currents $I_1$ and $I_2$ may vary directly as the absolute temperature varies. As a result, when the temperature increases, the first and second mirror currents $I_1$ and $I_2$ may also increase, and the threshold voltages $V_{TH1}$ and $V_{TH2}$ may decrease. The lower $V_{TH1}$ and $V_{TH2}$ may prolong the charging time or the periods of the first and second half cycles but the larger charging currents $I_1$ and $I_2$ may reduce the charging time, resulting in substantially the same charging time. Consequently, the periods of the first and second half cycles may not be significantly changed due to the temperature variation.

Figure 5B:
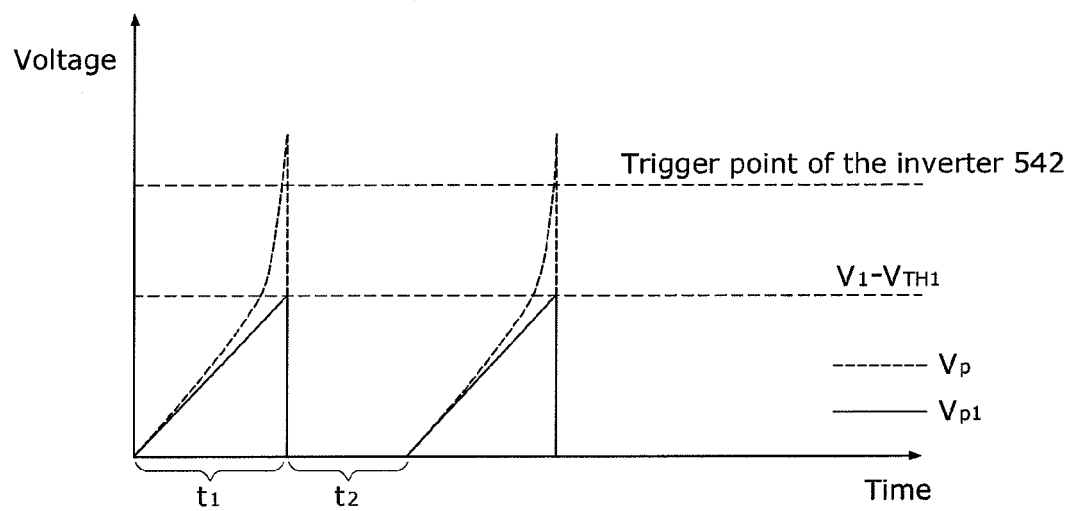
FIG. 5B is a diagram illustrating the drain voltage levels of a first transistor and a first discharging transistor of the clock generator illustrated in FIG. 5A.

FIG. 5B is a diagram illustrating the drain voltage levels of the first transistor $MN_{11}$ and the first discharging transistor $MN_{12}$ of the clock generator 50 illustrated in FIG. 5A. Referring to FIG. 5B, the drain voltage $V_{p1}$ of the first transistor $MN_{11}$ may increase due to the charging process during the first half cycle $t_1$, and the drain voltage $V_p$ of the first discharging transistor $MN_{12}$ may exceed the trigger point of the second inverter 542 as $V_{p1}$ reaches $V_1-V_{TH1}$. Furthermore, $V_{p1}$ and $V_p$ may be maintained at the reference or ground level due to the discharging process during the second half cycle $t_2$.

Figure 6A:
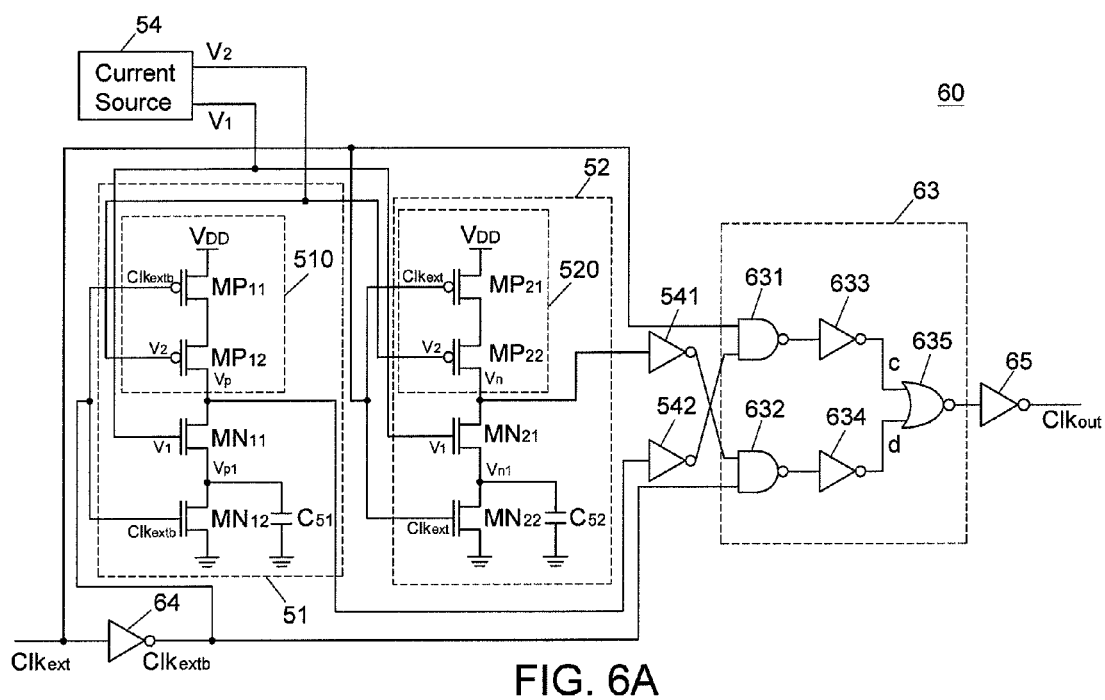
FIG. 6A is a circuit diagram of a clock generator to serve as frequency doubler according to an example of the present invention.

FIG. 6A is a circuit diagram of a clock generator 60 to serve as a frequency doubler according to another example of the present invention. Referring to FIG. 6A, the clock generator 60 may be similar to the clock generator 50 described and illustrated with reference to FIG. 5A except that, for example, the latch circuit 53 of the clock generator 50 may be replaced by a multiplier circuit 63. With the multiplier circuit 63, the clock generator 60 may serve as a frequency doubler. The multiplier circuit 63 may include a first NAND gate 631, a third inverter 633 in series with the first NAND gate 631, a second NAND gate 632, a fourth inverter 634 in series with the second NAND gate 632, and a NOR gate 635. The first NAND gate 631 may include a first input to receive a first external clock signal $Clk_{ext}$, and a second input coupled to the output of the second inverter 542. The second NAND gate 632 may include a first input to receive a second external clock signal $Clk_{extb}$, which is the complement of the first external clock signal $Clk_{ext}$ as a function of an inverter 64, and a second input coupled to the output of the first inverter 541. The NOR gate 635 may include a first input "c" coupled to the output of the third inverter 633, a second input "d" coupled to the output of the fourth inverter 634, and an output coupled to an inverter 65 at which an output clock signal $Clk_{out}$ is outputted. Furthermore, the first external signal $Clk_{ext}$ may be coupled to the gates of the first PMOS transistor $MP_{21}$ and the second discharging transistor $MN_{22}$, and the second external signal $Clk_{extb}$ may be coupled to the gates of the first PMOS transistor $MP_{11}$ and the first discharging transistor $MN_{12}$.

In operation, it may be assumed that initially the first external signal $Clk_{ext}$ is logic low while the second external signal $Clk_{extb}$ is logic high. The logic low $Clk_{ext}$ may turn on the first PMOS transistor $MP_{21}$ and turn off the second discharging transistor $MN_{22}$, which allows the second mirror current $I_2$ to charge the second capacitor $C_{52}$. The drain voltage of the second discharging transistor $MN_{22}$, "$V_{n1}$", may increase during the charging process until it reaches $V_1-V_{TH2}$. The second transistor $MN_{21}$ may be turned off as $V_{n1}$ reaches $V_1-V_{TH2}$, and at that time the drain voltage $V_n$ of the second transistor $MN_{21}$ may quickly rise above the trigger point of the first inverter 541, which turns on the first inverter 541 and switches the output of the first inverter 541 from logic high to logic low.

On the other hand, the logic high $Clk_{extb}$ may turn off the first PMOS transistor $MP_{11}$ and turn on the first discharging transistor $MN_{12}$, which cuts off the first mirror current $I_1$ and allows the first capacitor $C_{51}$ to discharge, resulting in a low voltage level $V_p$ not able to turn on the second inverter 542 so that the output of the second inverter 542 may be maintained at logic high.

As a result, the logic low $Clk_{ext}$ and the logic high output of the second inverter 542, by the function of the first NAND gate 631 and the third inverter 633, result in a logic low first input "c" to the NOR gate 635. Moreover, the logic high $Clk_{extb}$ and the logic low output of the first inverter 541, by the function of the second NAND gate 632 and the fourth inverter 634, result in a logic low second input "d" to the NOR gate 635.

Next, when the first external signal $Clk_{ext}$ is asserted, that is, changed to logic high, the second external signal $Clk_{extb}$ is logic low. The logic high $Clk_{ext}$ and the logic high output of the second inverter 542 result in a logic high first input "c" to the NOR gate 635. That is, the first input "c" is changed from logic low to logic high in response to the rising edge of the first external signal $Clk_{ext}$. Moreover, the logic low $Clk_{extb}$ and the logic low output of the first inverter 541 maintain the second input "d" at logic low. Meanwhile, the logic low $Clk_{extb}$ may turn on the first PMOS transistor $MP_{11}$ and turn off the first discharging transistor $MN_{12}$, which allows the first mirror current $I_1$ to charge the first capacitor $C_{51}$. The drain voltage of the first discharging transistor $MN_{12}$, "$V_{p1}$", may increase during the charging process until it reaches $V_1-V_{TH1}$. The first transistor $MN_{11}$ may be turned off as $V_{p1}$ reaches $V_1-V_{TH1}$, and at that time the drain voltage $V_p$ of the first transistor $MN_{11}$ may quickly rise above the trigger point of the second inverter 542, which turns on the second inverter 542 and switches the output of the second inverter 542 from logic high to logic low.

On the other hand, the logic high $Clk_{ext}$ may turn off the first PMOS transistor $MP_{21}$ and turn on and the second discharging transistor $MN_{22}$, resulting in a low voltage level $V_n$ not able to turn on the first inverter 541 so that the output of the first inverter 541 is changed to logic high. As a result, the logic high $Clk_{ext}$ and the logic low output of the second inverter 542 switch the logic high first input "c" to logic low. Moreover, the logic low $Clk_{extb}$ and the logic high output of the first inverter 541 still maintain the second input "d" at logic low. That is, the first input "c" may transit from low to high and then from high to low during the assertion of the first external signal $Clk_{ext}$, and the second input "d" is kept at logic low during the assertion of the first external signal $Clk_{ext}$. Similarly, the second input "d" may transit from low to high and then from high to low during the assertion of the second external signal $Clk_{extb}$, and the first input "c" is kept at logic low during the assertion of the second external signal $Clk_{extb}$.

Figure 6B:
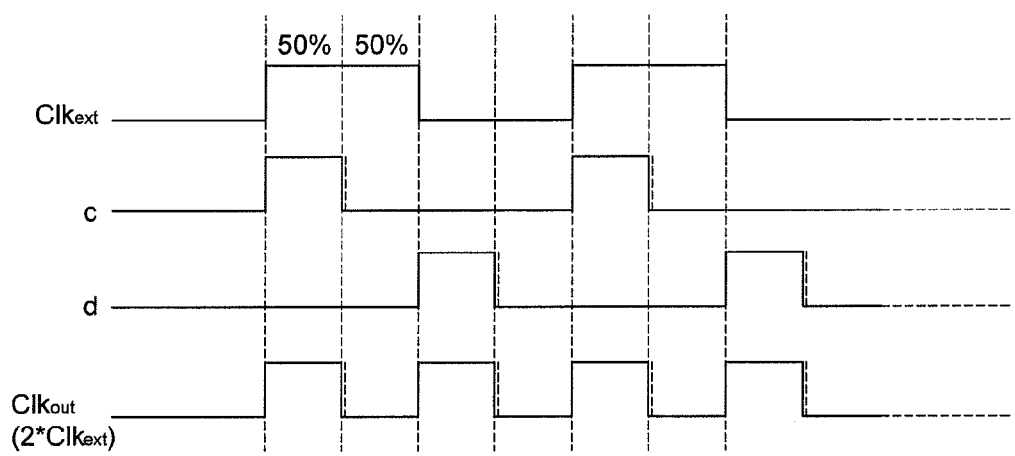
FIG. 6B is a diagram illustrating the waveforms of an external clock signal and an output clock signal of the clock generator illustrated in FIG. 6A.

FIG. 6B is a diagram illustrating the waveforms of the first external clock signal $Clk_{ext}$, the signals at the first and second inputs "c" and "d", and the output clock signal $Clk_{out}$ of the clock generator 60 described and illustrated with reference to FIG. 6A. Referring to FIG. 6B, the first input "c" may transit from low to high at the rising edge of the first external signal $Clk_{ext}$, and the second input "d" may transit from low to high at the falling edge first external signal $Clk_{ext}$ (which is the rising edge of the second external signal $Clk_{extb}$). In one example according to the present invention, the pulse width of the first external signal $Clk_{ext}$ may be predetermined, and the capacitances of the first and second capacitors $C_{51}$ and $C_{52}$ may then be determined so as to ensure a 50% duty cycle. For example, the pulse width of the first external signal $Clk_{ext}$ may be approximately 10 nanoseconds (ns), and the pulse widths of the signals at the first and second inputs "c" and "d" are approximately 5 ns. The deviations of the pulse widths of the signals at the inputs c and d may be insignificant. Consequently, the output clock signal $Clk_{out}$ may have a 50% duty cycle. The frequency of the output clock signal $Clk_{out}$ may be twice that of the first external clock signal $Clk_{ext}$. Accordingly, the clock generator 60 may serve as a frequency doubler.

It will be appreciated by those skilled in the art that changes could be made to the examples described above without departing from the broad inventive concept thereof It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A circuit for generating a clock signal, the circuit comprising:
    a current source to generate a reference current and provide a first voltage $V_1$;
    a first current generator to generate a first mirror current during a first half cycle based on the reference current;
    a first capacitor including a first end; and
    a first transistor having a first threshold voltage $V_{TH1}$, the first transistor including a gate to receive the first voltage $V_1$, a drain coupled to the first current generator and a source coupled to the first end of the first capacitor so as to allow the first mirror current to charge the first capacitor during the first half cycle,
    wherein the period of the first half cycle is a function of the first bias voltage $V_1$ minus the first threshold voltage $V_{TH1}$.

2. The circuit of claim 1, wherein the period of the first half cycle equals $C_1 (V_1-V_{TH1})/I_1$, wherein $C_1$ represents the capacitance of the first capacitor, and $I_1$ represents the magnitude of the first mirror current.

3. The circuit of claim 1, wherein the first current generator includes a p-type metal-oxide-semiconductor (PMOS) transistor, the PMOS transistor including a gate to receive a first control signal having a first state during the first half cycle and a second state during a second half cycle.

4. The circuit of claim 3 further comprising a first discharging transistor including a gate to receive the first control signal and a drain coupled to the first end of the first capacitor.

5. The circuit of claim 3 further comprising:
    a second current generator to generate a second mirror current during a second half cycle based on the reference current;
    a second capacitor including a first end; and
    a second transistor having a second threshold voltage $V_{TH2}$, the second transistor including a gate to receive the first voltage $V_1$, a drain coupled to the second current generator and a source coupled to the first end of the second capacitor so as to allow the second mirror current to charge the second capacitor during the second half cycle.

6. The circuit of claim 5 further comprising:
    a first inverter including an input coupled to the drain of the second transistor and a second inverter including an input coupled to the drain of the first transistor, wherein the first inverter is turned on when the second capacitor is charged to $(V_1-V_{TH2})$, and the second inverter is turned on when the first capacitor is charged to $(V_1-V_{TH1})$.

7. The circuit of claim 6 further comprising a latch circuit including a first NAND gate and a second NAND gate cross-coupled to each other, wherein the first NAND gate includes an input coupled to an output of the first inverter, and the second NAND gate includes an input coupled to an output of the second inverter.

8. The circuit of claim 6 further comprising a frequency multiplier circuit including:
    a first NAND gate including an input coupled to an output of the second inverter;
    a third inverter including and input coupled to an output of the first NAND gate;
    a second NAND gate including an input coupled to an output of the first inverter;
    a fourth inverter including and input coupled to an output of the second NAND gate; and
    a NOR gate including a first input coupled to an output of the third inverter and a second input coupled to an output of the fourth inverter.

9. A circuit for generating a clock signal, the circuit comprising:
    a first current generator to generate a first mirror current;
    a first capacitor;
    a first transistor coupled between the first current generator and the first capacitor, the first transistor having a first threshold voltage $V_{TH1}$ and including a gate to receive a first voltage $V_1$ so as to allow the first mirror current to charge the first capacitor during a first half cycle; and
    a first discharging transistor to allow the first capacitor to discharge during a second half cycle,
    wherein the period of the first half cycle is proportional to the first bias voltage $V_1$ minus the first threshold voltage $V_{TH1}$.

10. A clock generator circuit comprising:
    a current source; and
    a first clock circuit coupled to the current source, the first clock circuit comprising:
        a first current generator comprising a first transistor and a second transistor,
        wherein a source of the first transistor is coupled to a power supply and a drain of the first transistor is coupled to a source of the second transistor;
        a third transistor of which a drain is coupled to a drain of the second transistor;
        a fourth transistor of which a drain is coupled to a source of the third transistor and a source is grounded; and
        a first capacitor of which a first end is coupled to the source of the third transistor and a second end is grounded.

11. The circuit of claim 10, wherein the current source generates a reference current and provides a first voltage $V_1$, and the first current generator generates a first mirror current based on the reference current.

12. The circuit of claim 11, wherein the third transistor has a first threshold voltage $V_{TH1}$, the third transistor further including a gate to receive a first voltage $V_1$.

13. The circuit of claim 12 further comprising a first half cycle and a second half cycle, wherein the period of the first half cycle is a function of the first bias voltage $V_1$ minus the first threshold voltage $V_{TH1}$.

14. The circuit of claim 13, wherein the drain of the third transistor being coupled to the first current generator and the source of the third transistor being coupled to the first end of the first capacitor so as to allow the first mirror current to charge the first capacitor during the first half cycle.

15. The circuit of claim 14 further comprising:
    a second clock circuit coupled to the current source, the second clock circuit comprising:
        a second current generator comprising a fifth transistor and a sixth transistor,
        wherein a source of the fifth transistor is coupled to the power supply and a drain of the fifth transistor is coupled to a source of the sixth transistor;

a seventh transistor of which a drain is coupled to a drain of the sixth transistor;

an eighth transistor of which a drain is coupled to a source of the seventh transistor and a source is grounded; and a second capacitor of which a first end is coupled to the source of the seventh transistor and a second end is grounded.

16. The circuit of claim 15, wherein the drain of the seventh transistor being coupled to the second current generator and the source of the seventh transistor being coupled to the first end of the second capacitor so as to allow the second mirror current to charge the second capacitor during the first half cycle.

17. The circuit of claim 16 further comprising a first inverter including an input coupled to the drain of the seventh transistor and a second inverter including an input coupled to the drain of the third transistor, wherein the first inverter is turned on when the second capacitor is charged to ($V_1-V_{TH2}$), and the second inverter is turned on when the first capacitor is charged to ($V_1-V_{TH1}$).

18. The circuit of claim 17 further comprising a latch circuit including a first NAND gate and a second NAND gate cross-coupled to each other, wherein the first NAND gate includes an input coupled to an output of the first inverter, and the second NAND gate includes an input coupled to an output of the second inverter.

19. The circuit of claim 17 further comprising a frequency multiplier circuit including:

a first NAND gate including an input coupled to an output of the second inverter;

a third inverter including and input coupled to an output of the first NAND gate;

a second NAND gate including an input coupled to an output of the first inverter;

a fourth inverter including and input coupled to an output of the second NAND gate; and a NOR gate including a first input coupled to an output of the third inverter and a second input coupled to an output of the fourth inverter.

20. The circuit of claim 10, wherein the current source comprises:

a first buffer;

a second buffer; and a current mirror coupled to the first buffer and the second buffer, respectively.

* * * * *